United States Patent [19]

Miyao et al.

[11] Patent Number: 4,599,133
[45] Date of Patent: Jul. 8, 1986

[54] METHOD OF PRODUCING SINGLE-CRYSTAL SILICON FILM

[75] Inventors: Masanobu Miyao, Tokorozawa; Makoto Ohkura, Hachioji; Iwao Takemoto, Nishitama; Masao Tamura, Tokorozawa, all of Japan

[73] Assignee: Hitachi, Ltd., Tokyo, Japan

[21] Appl. No.: 491,544

[22] Filed: May 4, 1983

[30] Foreign Application Priority Data

May 7, 1982 [JP] Japan .................................. 57-75260

[51] Int. Cl.⁴ ............................................ C30B 13/24
[52] U.S. Cl. .................................................. 156/617 R
[58] Field of Search .............. 156/617 R, DIG. 102, 156/DIG. 80, 603; 148/1.5; 29/576 B; 427/43.1, 86, 53.1; 250/492.2, 492.3; 219/121 LB, 121 EB; 357/23 TF

[56] References Cited

U.S. PATENT DOCUMENTS

| 4,035,289 | 7/1977 | Ipri et al. ................................ 357/49 |
| 4,046,618 | 9/1977 | Chaudhari et al. .................. 156/603 |
| 4,059,461 | 11/1977 | Fan et al. ............................. 148/1.5 |
| 4,323,417 | 4/1982 | Lam ...................................... 156/613 |
| 4,330,363 | 5/1982 | Biegesen et al. ..................... 156/620 |
| 4,358,326 | 11/1982 | Doo ...................................... 148/1.5 |
| 4,375,993 | 3/1983 | Mori et al. ............................ 148/1.5 |
| 4,383,883 | 5/1983 | Mizutani ............................... 156/603 |
| 4,388,145 | 6/1983 | Hawkins et al. ................. 156/617 R |
| 4,403,400 | 9/1983 | Sakuri ................................... 148/1.5 |

Primary Examiner—Hiram H. Bernstein
Attorney, Agent, or Firm—Antonelli, Terry & Wands

[57] ABSTRACT

On a semiconductor substrate surface, a plurality of polycrystalline or amorphous silicon films and a plurality of insulator films which are substantially transparent to an irradiating energy beam and each of which has an opening are formed so as to be alternately stacked. Thereafter, the plurality of polycrystalline or amorphous silicon films are turned into a single crystal by irradiating them with the energy beam.

17 Claims, 3 Drawing Figures

METHOD OF PRODUCING SINGLE-CRYSTAL SILICON FILM

BACKGROUND OF THE INVENTION

1. Field of the Invention

The present invention relates to a method of producing a single-crystal silicon film. More particularly, it relates to a method of producing a single-crystal silicon film which is well-suited especially for forming a semiconductor device having a three-dimensional structure.

2. Description of the Prior Art

As is well known, conventional semiconductor devices have been formed in two dimensions within the surface regions of the major surfaces of semiconductor substrates.

However, when it is intended to extraordinarily increase the density of integration of a semiconductor device, a small number of elements can be formed per unit area and a sufficiently high density of integration is difficult to be attained with the conventional semiconductor device formed by arranging the elements in two dimensions.

When, unlike the two-dimensional arrangement of the semiconductor elements in the substrate surface, insulator films and single-crystal semiconductor films are alternately and successively stacked and formed on a semiconductor substrate surface and semiconductor elements such as transistors are formed within each of the single-crystal semiconductor films, the number of semiconductor elements which can be formed per unit area of a semiconductor chip or wafer increases remarkably, and this is very effective for enhancing the density of integration.

In order to realize a semiconductor device having such three-dimensional structure, a single-crystal semiconductor film having good characteristics needs to be formed on an insulator film. There have been proposed several methods of forming the single-crystal film on the insulator film.

One of them is a method called "bridging epitaxy (seeded lateral epitaxy)" in which, as shown in FIG. 1, an insulator film 3 having an opening 2 is formed in the vicinity of the surface of a semiconductor substrate 1, and a polycrystalline or amorphous silicon film 4 is deposited on the whole surface and is thereafter irradiated with a laser beam or electron beam 5 (Japanese Laid-open Patent Application No. 56-73697, and M. Tamura et al., Jpn. J. Appl. Physics, 19, L23, 1980).

This method can employ a continuous-wave (CW) laser (or electron beam) or pulse laser. Here, the case of using the CW laser (or electron beam) will be explained as an example. As illustrated in FIG. 1, first, the part of the polycrystalline or amorphous film 4 deposited on the opening 2 of the insulator film 3 is irradiated with the laser beam (or electron beam) 5. Then, since the polycrystalline or amorphous silicon film 4 is formed directly on the single-crystal silicon substrate 1 in the part of the opening 2, this part of the polycrystalline or amorphous silicon film 4 turns into the single crystal owing to upward epitaxial growth.

Subsequently, the laser beam (or electron beam) 5 is moved in the direction of an arrow 6 while being scanned substantially perpendicularly to the sheet of drawing. Then, lateral epitaxial growth develops to successively single-crystallize the part of the polycrystalline or amorphous silicon film 4 deposited on the insulator film 3.

With the bridging epitaxy as stated above, it is possible to produce the single-crystal silicon film which is continuous from on the surface of the semiconductor substrate to the insulator film.

With this method, however, only one layer of single crystal Si film can be formed by one operation of the irradiation with the laser beam or electron beam. Accordingly, in order to obtain, e. g., a three-layer structure composed of single-crystal Si film/insulator film/single-crystal Si film/insulator film/Si substrate, it is necessary that the structure shown in FIG. 1 is once irradiated with the laser beam or electron beam so as to form one layer of single-crystal film, whereupon the surface of the single-crystal film is oxidized, and a polycrystalline or amorphous Si film is further deposited thereon and irradiated with the laser beam or electron beam as a second operation. With such method, the operations of irradiation with the laser beam or electron beam need to be repeated in a number equal to the number of the single-crystal Si layers to be grown, and the process is extremely complicated. This forms the first disadvantage. The second disadvantage is the variation of a surface shape developing after the irradiation with the laser beam or electron beam. More specifically, when the laser beam or electron beam is scanningly projected, the Si surface layer is once melted and then solidified due to temperature fall, so that the surface of the polycrystalline or amorphous silicon film becomes uneven. Accordingly, when such uneven surface of the polycrystalline or amorphous silicon film is oxidized and the second polycrystalline or amorphous Si film is deposited thereon and is irradiated with the laser beam or electron beam, the surface becomes more uneven. That is, the uneven parts to appear in the surface become greater with increase in the number of times of the irradiation with the laser beam or electron beam.

Needless to say, such single-crystal silicon film having the great uneven parts in the surface is unsuitable for the formation of a semiconductor device having a high density of integration. There has been eagerly requested a method by which a single-crystal semiconductor film having a flat surface of slight unevenness can be formed on an insulator film.

SUMMARY OF THE INVENTION

An object of the present invention is to solve the problems in the prior art, and to provide a method of producing a single-crystal film by which a single-crystal semiconductor film having a flat surface of slight unevenness can be formed on an insulator film.

Another object of the present invention is to provide a method of producing a single-crystal semiconductor film by which a plurality of single-crystal semiconductor films having flat surfaces of slight unevenness can be stacked and formed alternately with insulator films.

Another object of the present invention is to provide a method of producing a single-crystal semiconductor film by which a structure including a part with a plurality of single-crystal semiconductor films and insulator films stacked alternately can be formed owing to only one operation of irradiation with a laser beam or electron beam without performing a plurality of irradiation operations.

An object of the present invention is to solve the problems in the prior art, and to provide a method of producing single-crystal silicon by which a multilayer structure constructed of single-crystal Si and insulator films can be realized owing to only one operation of scanning and irradiating a laser beam or electron beam.

In order to accomplish the objects, according to the present invention, a plurality of polycrystalline or amorphous silicon films and a plurality of insulator films having openings are alternately stacked on a single-crystal Si substrate, and they are thereafter scanningly irradiated with a laser beam or electron beam, whereby the plurality of polycrystalline or amorphous silicon films are single-crystallized.

DETAILED DESCRIPTION OF THE PREFERRED EMBODIMENTS

Figure 1:
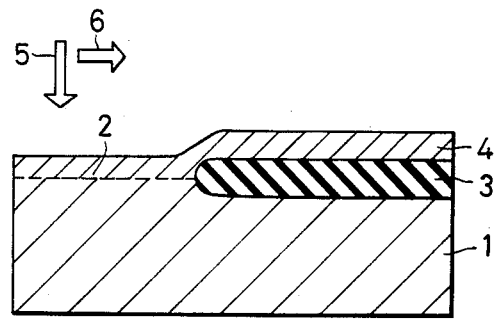
FIG. 1 is a sectional model view for explaining bridging epitaxy in a prior art.
Figure 2:
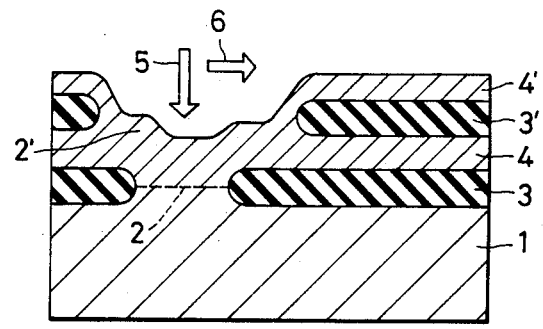
FIGS. 2 and 3 sectional model views for explaining different embodiments of the present invention.

In the present invention, the growth of a single crystal is executed by the following two steps. The first step is a step in which the stage of forming an insulator film having an opening on a single-crystal silicon substrate and then depositing a polycrystalline or amorphous silicon film on the whole surface of the insulator film is repeated a plurality of times, whereby a multilayer structure with the polycrystalline or amorphous silicon films and the insulator films stacked alternately is formed on the single-crystal silicon substrate. FIG. 2 shows an example. The sizes of openings 2 and 2' in a first insulator film (lower layer) 3 and a second insulator film (upper layer) 3' are unequal. In the case of FIG. 2, the smaller opening, namely, the opening 2 of the first insulator film 3 acts as an opening common to the first and second insulator films 3 and 3'.

The second step is a step in which a laser beam or electron beam is scanningly irradiated to single-crystallize the polycrystalline or amorphous silicon films.

In this case, the polycrystalline or amorphous silicon films 4 and 4' deposited by the first step are melted and then solidified into the single crystal, first in a region corresponding to the common opening 2.

The growth of the single crystal proceeds onto the insulator films 3 and 3' with the scanning of the laser beam or electron beam. As a result, both the polycrystalline or amorphous silicon films 4 and 4' of the lower and upper layers turn into the single crystal, and the structure with the plurality of single-crystal films and insulator films stacked alternately as seen from FIG. 2 is formed.

The method will be described more in detail in connection with an example.

As shown in FIG. 2, $SiO_2$ films 3, 3' and polycrystalline silicon films 4, 4' were formed near the major surface of a single-crystal silicon substrate 1 by well-known techniques. All the thicknesses of the $SiO_2$ films 3, 3' and the polycrystalline Si films 4, 4' were 1000 Å. Next, as a laser beam 5, the beam of an Ar laser oscillating at an output of 12 W was converged to a diameter of 20 μm and was scanningly irradiated at a rate of 20 cm/second. When the structure thus obtained was observed with an electron microscope, it was noted that the polycrystalline silicon film 4' of the upper layer was crystal-grown about 80 μm from the end of the $SiO_2$ film 3' onto this $SiO_2$ film 3'. On the other hand, the polycrystalline silicon film 4 of the lower layer was crystallized, but the crystallinity of the crystal was not very good. Moreover, the distance of the lower layer single-crystallized by the crystal growth was about 40 μm from the end part of the insulator film 3 and was shorter than in the case of the upper layer.

One cause therefor is conjectured as follows. Since the absorption coefficient of silicon for light is very great in the wavelength region (0.51 μm) of the Ar laser, the laser beam did not reach the polycrystalline silicon film 4 of the lower layer, while since the thermal conductivity of the $SiO_2$ film is very low, the heat of the polycrystalline silicon film 4' of the upper layer heated by the laser irradiation did not sufficiently reach the polycrystalline silicon film 4 of the lower layer, so that the heating of the polycrystalline silicon film 4 of the lower layer was insufficient.

Therefore, using a YAG laser beam (wavelength: 1.06 μm) for which the absorption coefficient of Si is small, the polycrystalline silicon films 4, 4' of the upper and lower layers were simultaneously heated. More specifically, the beam of a YAG laser oscillating at an output of 30 W was converged to a diameter of 20 μm and was projected while being scanned in the direction of an arrow 6 at a rate of 20 cm/second. When the structure thus treated was observed with an electron microscope, it was confirmed that both the polycrystalline silicon layers 4, 4' of the upper and lower layers were crystallized over regions of 80 μm extending from the ends of the $SiO_2$ films 3, 3' onto these $SiO_2$ films. In both the cases where the Ar laser and the YAG laser were scanned and caused to project the beams, the uneven parts of the surfaces were slight. The reason will be that, even during the laser irradiation, the $SiO_2$ film intervening between the polycrystalline or amorphous silicon films did not melt and accordingly prevented the deformation of the polycrystalline or amorphous silicon films. In addition, since $SiO_2$ is almost transparent to the YAG laser radiation, the YAG laser beam can readily pass through the $SiO_2$ film 3' intervening between the polycrystalline or amorphous silicon films 4, 4' to reach the polycrystalline or amorphous silicon film 4 of the lower layer and to heat it.

The size of the single-crystal silicon film produced by the present example was approximately 80 μm extending from the end part of the underlying $SiO_2$ film onto this $SiO_2$ film. In order to actually form a semiconductor device, it is favorable that the size is as large as possible.

Figure 3:
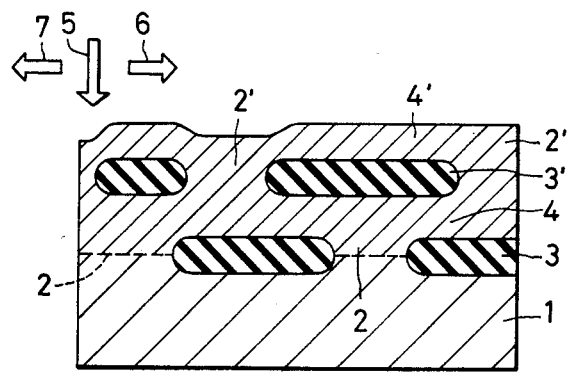

This is achieved by providing each of $SiO_2$ films 3, 3' with a large number of openings 2, 2' and scanning a laser beam 5 in opposite directions 6, 7 alternately, as in another example shown in FIG. 3. With this measure, the single-crystallization proceeds from both the end parts of each of the $SiO_2$ films 3, 3' onto this $SiO_2$ film, so that a very large single-crystal film can be formed.

Although the openings 2 and 2' are common in the case of FIG. 2, the opening 2' of the upper layer and the opening 2 of the lower layer need not always lie in common positions as seen from FIG. 3. However, the existence of the common openings is very preferable in practical use.

In the example shown in FIG. 3, all the thicknesses of the polycrystalline silicon films 4, 4' and $SiO_2$ films 3, 3' were 1000 Å, and the widths of the $SiO_2$ films 3, 3' were not greater than 160 μm. The beam of a YAG laser oscillating at an output of 30W was converged to a diameter of 20 μm, and was irradiated on the structure formed as described above, while being scanned at a rate of 20 cm/second. Thereafter, the crystallinity was assessed by the use of observation with an electron microscope. Then, it was confirmed that both the polycrystalline silicon films 4 and 4' were entirely single-crystallized.

As described above, according to the present invention, a plurality of polycrystalline or amorphous silicon films and a plurality of insulator films having openings are alternately stacked and formed, and a laser beam or electron beam is irradiated from above, whereby the plurality of polycrystalline or amorphous silicon films are single-crystallized.

The present invention, however, is not restricted to the scanning of the stacked structure by the laser beam or electron beam. Even when a well-known rectilinear strip heater is sequentially moved in the directions of the arrows 6 and 7, the single-crystallization can be attained, and this measure is applicable to the present invention.

Regarding the laser, the YAG laser is favorable as described above. With this laser, the best results were obtained. When a pulse laser is used, the distance over which the polycrystalline or amorphous silicon film can be single-crystallized from the end part of the insulator film onto this insulator film is small, and hence, the use of a CW laser is favorable.

The electron beam needs to be employed in vacuum, but it has a long distance of permeation. It is also usable in the present invention.

In the above examples, the $SiO_2$ film was used as the insulator film. However, $Si_3N_4$ and phosphosilicate glass are equivalent to $SiO_2$ in the coefficient of absorption of the laser beam and the stopping power of the electron beam, and the films of these substances can be used in the present invention similarly to the $SiO_2$ film.

As stated before, in the present invention, the surface is prevented from becoming uneven at the single-crystallization step owing to the insulator film formed thereon. In order to effectively prevent the occurrence of the uneven parts, the thickness of the insulator film needs to be great to some extent and should favorably be approximately 200 Å or above. On the other hand, when the insulator film is too thick, it is feared that the polycrystalline or amorphous silicon film will have a conspicuous step. From the standpoint of practical use, therefore, the thickness is set at approximately 1 $\mu$m or below.

Although, in the examples of FIGS. 2 and 3, the laser beam 5 was irradiated with the polycrystalline silicon film 4' of the upper layer exposed, it is a matter of course that the laser beam 5 may be irradiated in the state in which the surface of the polycrystalline or amorphous silicon film 4' of the upper layer is covered with the insulator film. Thus, the occurrence of the uneven parts of the surface of the upper polycrystalline or amorphous silicon film 4' is effectively prevented.

The maximum thickness to which the polycrystalline or amorphous silicon film can be single-crystallized by the laser irradiation is approximately 10 $\mu$m.

When it is intended to single-crystallize a polycrystalline or amorphous silicon film thicker than about 10 $\mu$m by irradiating it with a CW laser beam or an electron beam, the irradiation needs to be of very high intensity in order to single-crystallize the lowermost part of the polycrystalline or amorphous silicon film. Such irradiation of high intensity, however, melts the vicinity of the surface of the polycrystalline or amorphous silicon film excessively, resulting in conspicuous deformation.

Accordingly, the sum of the thicknesses of the plurality of polycrystalline or amorphous silicon films in the present invention should favorably be at most approximately 10 $\mu$m to the end of preventing the excessive melting and deformation of the uppermost layer and reliably single-crystallizing the lowermost layer.

After the respective polycrystalline or amorphous silicon films have been single-crystallized, such elements as transistors are formed within the films. Finally, a semiconductor integrated circuit having a three-dimensional structure as a whole is formed. In order to form the transistors or the like in the part corresponding to each polycrystalline or amorphous silicon film, the thickness of each film should favorably be at least 1000 Å. On the other hand, an excessive thickness is wasteful. Therefore, the thickness of each polycrystalline or amorphous silicon film to be single-crystallized is selected from a range of 1000 Å – 1 $\mu$m.

Since the maximum thickness of the polycrystalline or amorphous film which can be single-crystallized in the present invention is about 10 $\mu$m as stated before, up to 10 layers of polycrystalline or amorphous silicon films can be single-crystallized, assuming that each of the polycrystalline or amorphous silicon films to be stacked alternately with the insulator films to 1 $\mu$m thick.

When the intensity of the laser beam or electron beam is excessively high, the melting of the uppermost layer and the consequent deformation thereof become excessive, and when it is excessively low, the single-crystallization of the lower layers becomes insufficient. For these reasons, the intensity of the laser beam or electron beam to be irradiated is selected from a range of 10 W – 50 W or so.

As understood from the above description, the present invention consists in that a plurality of polycrystalline or amorphous silicon films are stacked and formed on a semiconductor substrate alternately with a plurality of insulator films which are substantially transparent to an irradiating energy beam (laser beam or electron beam) and each of which has openings, whereupon the resultant structure is irradiated with the energy beam so as to single-crystallize the polycrystalline or amorphous silicon films.

Thus, the plurality of polycrystalline or amorphous silicon films can be turned into the single crystal by one operation of irradiating them with the energy beam or heating them by means of a strip heater. Moreover, at the melting and solidification of the polycrystalline or amorphous silicon, the surface is effectively prevented from becoming uneven owing to the insulator films.

Accordingly, it becomes possible to form a semiconductor device of three-dimensional structure in which a plurality of single-crystal silicon films and insulator films are alternately stacked on a silicon substrate. This is very useful for enhancing the density of integration of a semiconductor device.

What is claimed is:
1. A method of producing a single-crystal silicon film comprising the steps of:
(a) forming a plurality of insulator films each having an opening and a plurality of polycrystalline or amorphous silicon films on one major surface of a single-crystal substrate, said insulator films and said silicon films being alternately stacked with at least a portion of a silicon film being in contact with the single-crystal substrate, and

(b) single-crystallizing said polycrystalline or amorphous silicon films by irradiating the plurality of polycrystalline or amorphous silicon films at once with a laser beam or an electron beam; the heat generated by the beam being so controlled and the thickness of the insulator films being so selected that the plurality of polycrystalline or amorphous silicon films are simultaneously heated whereby each of the silicon films is single-crystallized.

2. A method of producing a single-crystal silicon film as defined in claim 1, wherein said insulator films are substantially transparent to said laser beam or electron beam.

3. A method of producing a single-crystal silicon film as defined in claim 2, wherein said each insulator film is selected from the group consisting of an $SiO_2$ film, an $Si_3N_4$ film and a phosphosilicate glass film.

4. A method of producing a single-crystal silicon film as defined in claim 3, wherein said laser beam is a YAG laser beam.

5. A method of producing a single-crystal silicon film as defined in claim 4, wherein said YAG laser beam is a continuous-wave laser beam.

6. A method of producing a single-crystal silicon film as defined in claim 1, wherein a thickness of each insulator film is approximately 200 Å to 1 μm.

7. A method of producing a single-crystal silicon film as defined in claim 1, wherein a sum of thicknesses of said plurality of polycrystalline or amorphous silicon films is at most approximately 10 μm.

8. A method of producing a single-crystal silicon film as defined in claim 1, wherein a thickness of each polycrystalline or amorphous silicon film is 1000 Å to 1 μm.

9. A method of producing a single-crystal silicon film as defined in claim 1, wherein a magnitude of the irradiation with said laser beam or electron beam is approximately 10 W to 50 W.

10. A method of producing a single-crystal silicon film as defined in claim 1, wherein an insulator film is formed on the uppermost one of said polycrystalline or amorphous silicon films.

11. A method of producing a single-crystal silicon film comprising the steps of:
(a) forming a plurality of insulator films each having an opening and a plurality of polycrystalline or amorphous silicon films on one major surface of a single-crystal substrate, said insulator films and said silicon films being alternately stacked with at least a portion of a silicon film being in contact with the single-crystal substrate, and
(b) single-crystallizing said polycrystalline or amorphous silicon films by heating the plurality of polycrystalline or amorphous silicon films at once with a strip heater; the heat generated by the strip heater being so controlled and the thickness of the insulator films being so selected that the plurality of polycrystalline or amorphous silicon films are simultaneously heated.

12. A method of producing a single-crystal silicon film comprising the steps of:
(a) forming a first insulator film having an opening on one major surface of a single-crystal silicon substrate;
(b) forming a first polycrystalline or amorphous silicon film on said first insulator film;
(c) forming a second insulator film having an opening on said first polycrystalline or amorphous silicon film;
(d) forming a second polycrystalline or amorphous silicon film on said second insulator film; and
(e) irradiating said first and second polycrystalline or amorphous silicon films simultaneously with a laser beam or electron beam; the heat generated by the beam being so controlled and the thickness of the insulator films being so selected that said first and second polycrystalline or amorphous silicon films are simultaneously heated whereby each of the silicon films is single-crystallized.

13. A method of producing a single-crystal silicon film as defined in claim 12, wherein said laser beam is a YAG laser beam operating in a continuous-wave mode.

14. A method of producing a single-crystal silicon film as defined in claim 12, wherein the magnitude of irradiation of said laser beam or electron beam is approximately 10 W to 50 W.

15. A method of producing a single-crystal silicon film as defined in claim 12, wherein each polycrystalline or amorphous silicon film has a thickness of from 1,000 Å to 1 μm.

16. A method of producing a single-crystalline silicon film as defined in claim 15, wherein each insulator film is formed from a material selected from the group consisting of $SiO_2$, $Si_3N_4$ and a phosphosilicate glass.

17. A method of producing a single-crystalline silicon film as defined in claim 12, wherein a thickness of each insulator film is approximately 200 Å to 1 μm.

* * * * *